United States Patent
Gorczyca et al.

(10) Patent No.: US 7,018,580 B2
(45) Date of Patent: Mar. 28, 2006

(54) METHOD AND APPARATUS FOR FORMING TAPERED WAVEGUIDE STRUCTURES

(75) Inventors: Thomas Bert Gorczyca, Schenectady, NY (US); Christopher James Kapusta, Duanesburg, NY (US); Samhita Dasgupta, Niskayuna, NY (US); Stacey Joy Goodwin, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 376 days.

(21) Appl. No.: 10/248,095

(22) Filed: Dec. 18, 2002

(65) Prior Publication Data

US 2004/0119197 A1    Jun. 24, 2004

(51) Int. Cl.
*B29C 33/38*    (2006.01)
(52) U.S. Cl. .............................. 264/219; 216/2; 216/24; 264/1.24
(58) Field of Classification Search ................ 264/219, 264/1.24; 216/2, 24
See application file for complete search history.

(56) References Cited

U.S. PATENT DOCUMENTS

| | | | |
|---|---|---|---|
| 4,397,711 A | 8/1983 | Donnelly et al. ........... 156/643 |
| 4,466,696 A | 8/1984 | Carney ..................... 350/96.2 |
| 4,779,946 A | 10/1988 | Pimpinella et al. ......... 350/96.2 |
| 4,897,711 A | 1/1990 | Blonder et al. ............... 357/74 |
| 5,238,877 A * | 8/1993 | Russell ......................... 438/31 |
| 5,613,024 A * | 3/1997 | Shahid ........................ 385/52 |
| 5,632,908 A * | 5/1997 | Shahid .......................... 216/2 |
| 5,804,314 A * | 9/1998 | Field et al. ................. 428/402 |
| 6,030,540 A | 2/2000 | Yamamoto et al. ........... 216/47 |
| 6,200,502 B1 | 3/2001 | Paatzsch et al. ........... 264/1.25 |
| 6,272,275 B1 | 8/2001 | Cortright et al. ........... 385/129 |
| 6,294,398 B1 * | 9/2001 | Kim et al. .................... 438/22 |
| 6,344,148 B1 * | 2/2002 | Park et al. ...................... 216/2 |
| 6,393,685 B1 * | 5/2002 | Collins ......................... 29/416 |
| 6,470,117 B1 | 10/2002 | Tang et al. ................... 385/43 |
| 6,639,735 B1 * | 10/2003 | Park et al. .................. 359/741 |

OTHER PUBLICATIONS

R. E. Oosterbroek, J. W. (Erwin) Berencshot, H. V. Jansen, A. J. Nijdam, G. Pandraud, A. van den Berg, and M. K. Elwenspoek; Etching Methodologies in <111> -Oriented Silicon Wafers; Journal of Microelectromechanical Systems, vol. 9, No. 3, Sep. 2000; pp. 390-398.

T. Haatainen, J. Ahopelto, G. Gruetzner, M. Fink, K. Pfeiffer; "Step & Stamp Imprint Lithography Using a Commercial Flip Chip Bonder".

* cited by examiner

Primary Examiner—Allan R. Kuhns
(74) Attorney, Agent, or Firm—Fletcher Yoder

(57) ABSTRACT

A method of fabricating a stamping mold suitable for use in the formation of a tapered waveguide structure includes defining a stamping pattern upon the surface of a silicon wafer, and removing portions of the silicon wafer surface in accordance with the stamped pattern, thereby creating tapered vertical surfaces within the wafer.

10 Claims, 4 Drawing Sheets

METHOD AND APPARATUS FOR FORMING TAPERED WAVEGUIDE STRUCTURES

BACKGROUND OF INVENTION

The present disclosure relates generally to optical waveguide fabrication and, more particularly, to a method and apparatus for forming tapered waveguide structures.

Communication systems continue to be developed in which optical waveguides such as optical fibers are used as conductors for modulated light waves to transmit information. These fibers may be utilized for long distance communication networks, fiber-to-home networks, wide area networks, and/or local area networks. Moreover, with recent advances in information processing technology involving computers and the like, the need and desire to process and transmit massive amounts of data at high speeds have increased. As such, optical components have continued to become more and more reduced in size as the degree of integration thereof is increased.

In certain optical applications, the out-of-plane coupling of light from light emitting devices such as laser diodes (e.g., a Vertical Cavity Surface Emitting Laser or "VCSEL") through light carrying structures (e.g., an optical fiber or other waveguide structure) requires ultra-precise waveguide geometries in the fabrication of such components. For example, FIGS. 1(a) and 1(b) illustrate an exemplary optical coupling system 100 in which a VCSEL 102 emits a vertically oriented light beam 104 to be propagated through a waveguide 106 along a horizontal path with respect to the vertical axis of the light beam 104. The waveguide 106 (shown as a multimode waveguide in FIG. 1(a), and as a single mode waveguide in FIG. 1(b)) further includes a downwardly tapered surface 108 that essentially acts a 45 degree mirror to reflect the upwardly directed incident optical beam 90 degrees horizontally down the waveguide 106.

In order to maintain efficient optical coupling within the system 100, the alignment tolerances of the components are generally required to fall within precise ranges. For example, the angle of the waveguide taper itself (e.g., a 45 degree angle) should be accurate to within about +/−2 degrees. In addition, the actual location of the taper with respect to the waveguide itself should also be accurate to within about 0.5 μm. Thus, it will be appreciated that in order to produce a practical tapered waveguide coupling system, a cost-effective manufacturing process is desirable.

In the past, several methods have been implemented to produce these tapered waveguide structures. One example of an existing method of tapered waveguide formation involves the use of a gray scale mask to define the desired waveguide pattern and thereafter performing reactive ion etching to transfer the pattern directly into a waveguide layer material formed on a substrate. Although this method has shown promising results, it is extremely process intensive. In addition, the accuracy of the transferred taper angle is highly sensitive to the process variables such as type of photoresist, etch conditions, etc. As a result, the goal of achieving a reliable, repeatable process using a grey scale mask and/or other direct etching techniques may be a difficult proposition.

SUMMARY OF INVENTION

The above discussed and other drawbacks and deficiencies of the prior art are overcome or alleviated by a method of fabricating a stamping mold suitable for use in the formation of a tapered waveguide structure. In an exemplary embodiment, the method includes defining a stamping pattern upon the surface of a silicon wafer, and removing portions of the silicon wafer surface in accordance with the stamped pattern, thereby creating tapered vertical surfaces within the wafer.

In another aspect, a method of forming a tapered waveguide structure includes defining a stamping pattern upon the surface of a silicon wafer, and removing portions of said silicon wafer surface in accordance with the stamped pattern, thereby creating tapered vertical surfaces within the wafer. The silicon wafer is further sectioned so as to create an individual mold therefrom, the mold including a single tapered surface. In addition, a substrate is coated with a waveguide material, and the waveguide material is compression molded with the individual mold, thereby transferring the single tapered surface of the mold onto a corresponding tapered surface on the waveguide material.

In still another aspect, a waveguide stamping mold includes a silicon wafer having a tapered vertical surface formed by crystallographic etching thereof, the tapered vertical surface also having a selected angle with respect to a horizontal surface of the wafer.

BRIEF DESCRIPTION OF DRAWINGS

Referring to the exemplary drawings wherein like elements are numbered alike in the several Figures.

DETAILED DESCRIPTION

Disclosed herein is a method of fabricating a stamping mold that may be used in the formation of a precise tapered waveguide structure(s). Broadly stated, the mold (also interchangeably referred to hereinafter as a "stamp") is formed by lithographic patterning and isotropic etching of a silicon wafer that is initially cut or cleaved off-axis. The crystal properties of the off-axis wafer are such that, when etched, the resulting vertical faces of the wafer surfaces are formed at a 45-degree angle with respect to the normal. As a result of a desired mold pattern being formed within the wafer, a stamping mold is created that may then be used to create the tapered waveguide structures, as is described in further detail hereinafter.

Figure 2:
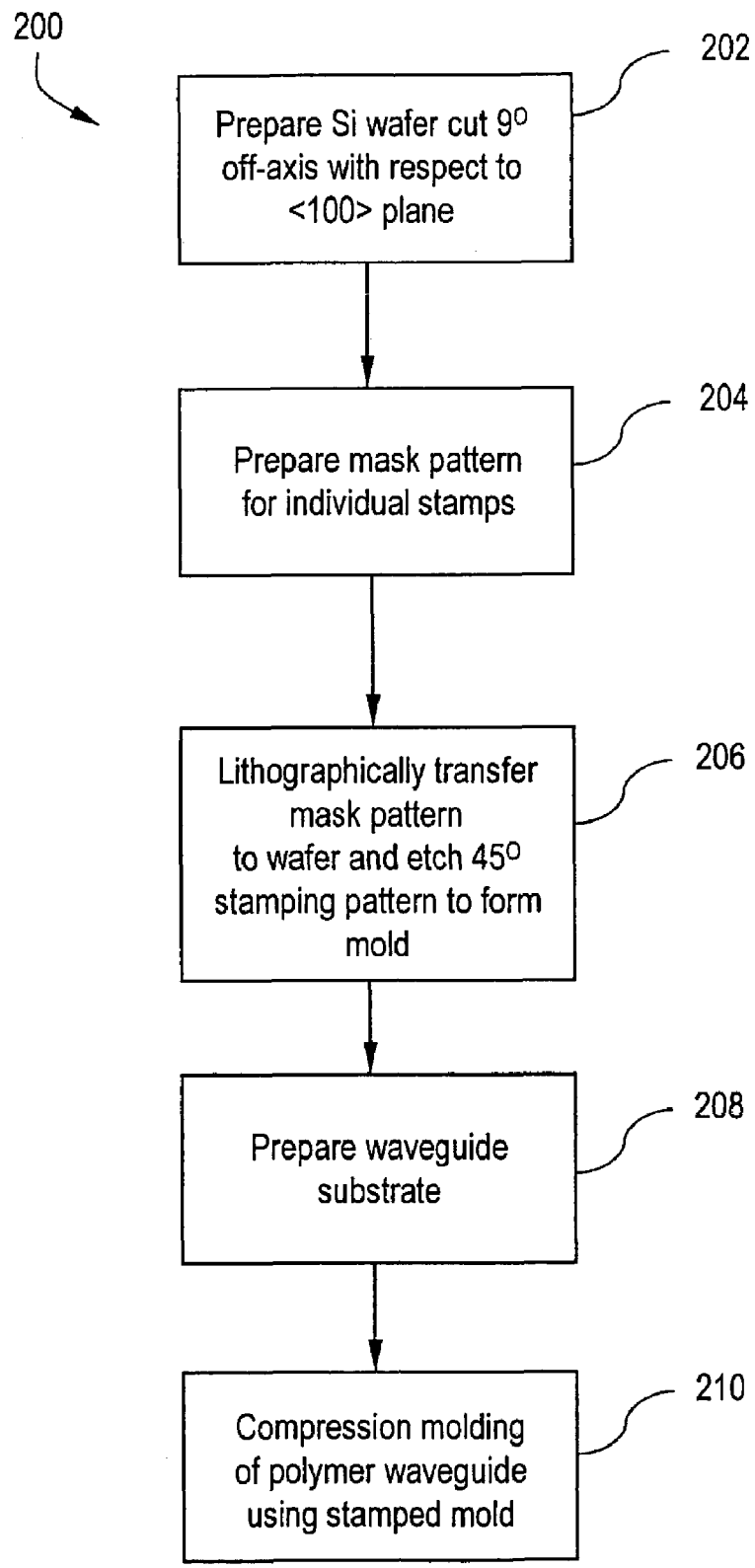
FIG. 2 is a process flow diagram 200 illustrating a method of fabricating a stamping mold that may be used in the formation of a precise, tapered waveguide structure, in accordance with an embodiment of the invention.

Referring initially to FIG. 2, there is shown a process flow diagram 200 illustrating a method of fabricating a stamping mold, and the subsequent use of the mold to stamp the desired feature (e.g., a 45 degree taper) on to the optical waveguide material, thereby creating a tapered waveguide structure. The process starts at block 202 with the preparation of a silicon wafer that is cut 9 degrees off axis with respect to the <100> plane. A subsequent etching of the off axis surface to the wafer will then create the desired 45-degree angled surface for the formation of the waveguide taper.

In block 204, a mask pattern is prepared in accordance with a desired number and size of individual silicon stamps. It will be appreciated that the specific mask pattern may be tailored to suit the particular size and shape of the tapered waveguide structures to be formed. The prepared mask is then used to transfer the pattern to the wafer for isotropic etching. As shown in block 206, openings are defined onto the silicon wafer using standard photolithographic masking steps. The patterned silicon wafer is then isotropically etched using standard etchant solutions (e.g., KOH), wherein the etching can be timed to reach the desired depth for the mold structures. The use of the <100> silicon wafers cut about 9 degrees off axis results in the vertical faces of the structure (i.e., in the <111> plane) being formed at a 45-degree angle to the normal. This geometry is determined by the crystallographic orientation of silicon, wherein an etch process of <100> silicon wafers exposes facets in <111> plane that are at an angle of about 54.7 degrees with respect to the <100> plane. Additional details regarding etching mechanisms and the orientation of silicon crystal planes may be found in "Etching Methodologies in +111,—Oriented Silicon Wafers", R. Edwin Oosterbroek, et al., Journal of Microelectromechanical Systems, Vol. 9, No. 3, September, 2000.

Following the formation of the molds (stamps), the waveguide material is prepared, as shown in block 208, such as by forming a thin polymer layer upon a substrate. Lastly, in block 210, an individual mold is used for the compression molding of the polymer waveguide. Preferably, the mold is placed at the desired location on the substrate using an accurate-placement bonding tool. The mold is then compressed onto the substrate location with a sufficient amount of force and heat such that the tapered surface characteristic is "stamped" onto the substrate material. This pattern can then be repeated in all the desired locations using the stamping process.

Figure 3A:
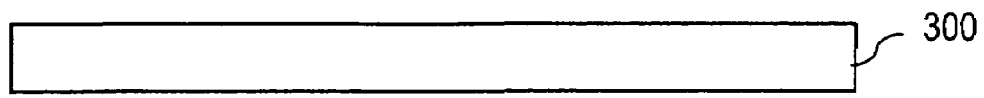
FIGS. 3(a) through 3(e) are sectional views illustrating a masking and etching process used to form the individual stamping molds.
Figure 3B:
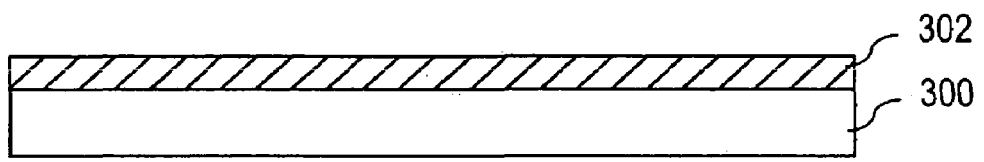
Figure 3C:
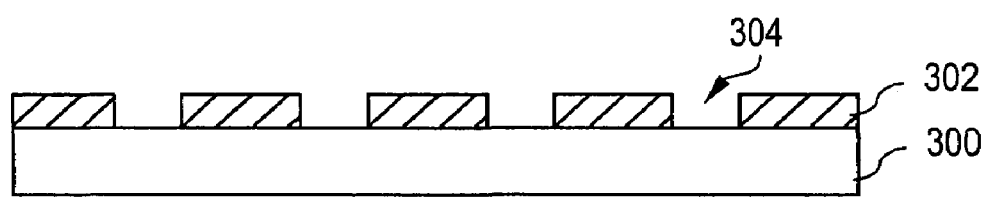
Figure 3D:
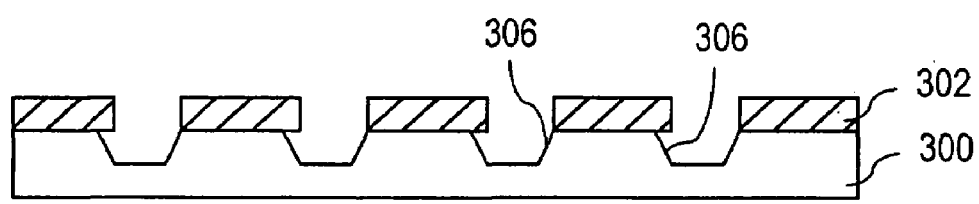
Figure 3E:
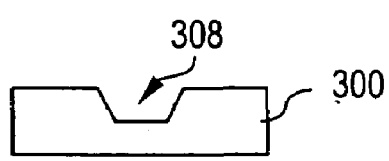

FIGS. 3(a) through 3(f) illustrate an exemplary masking and etching sequence that may be used to define a plurality of 45-degree molds. In particular, FIG. 3(a) is a section view of a silicon wafer 300 that is cut about 9 degrees off axis with respect to the <100> plane. In FIG. 3(b), a photoresist material 302 is applied over the wafer 300 and, as shown in FIG. 3(c), mask openings 304 are defined and formed in accordance with standard photolithographic techniques. Then, as shown in FIG. 3(d), the exposed portions of the wafer 300 are isotropically etched (a slight underetching beneath the mask may be noted), thereby creating smooth, angled vertical surfaces 306 along the <111> facets. These surfaces 306 are at the desired 45-degree angle with respect to the wafer surface, for the reasons discussed above. After the wafer 300 has been etched to a desired depth, the resist material 302 is removed and the wafer 300 cleaned. FIG. 3(e) illustrates a portion of the wafer 300, after the etching and cleaning steps, revealing a trapezoid shaped opening 308.

Figure 1A:
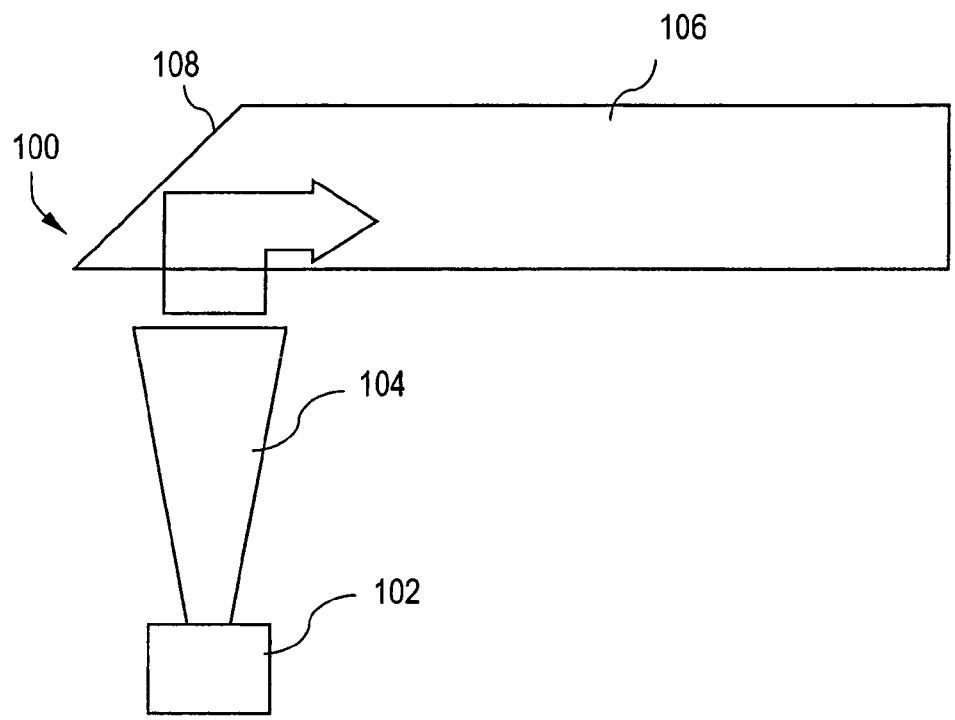
FIGS. 1(a) and 1(b) illustrate an exemplary optical coupling system in which a Vertical Cavity Surface Emitting Laser (VCSEL) emits a vertically oriented light beam to be propagated through a tapered waveguide along a horizontal path with respect to the vertical axis of the light beam.
Figure 1B:
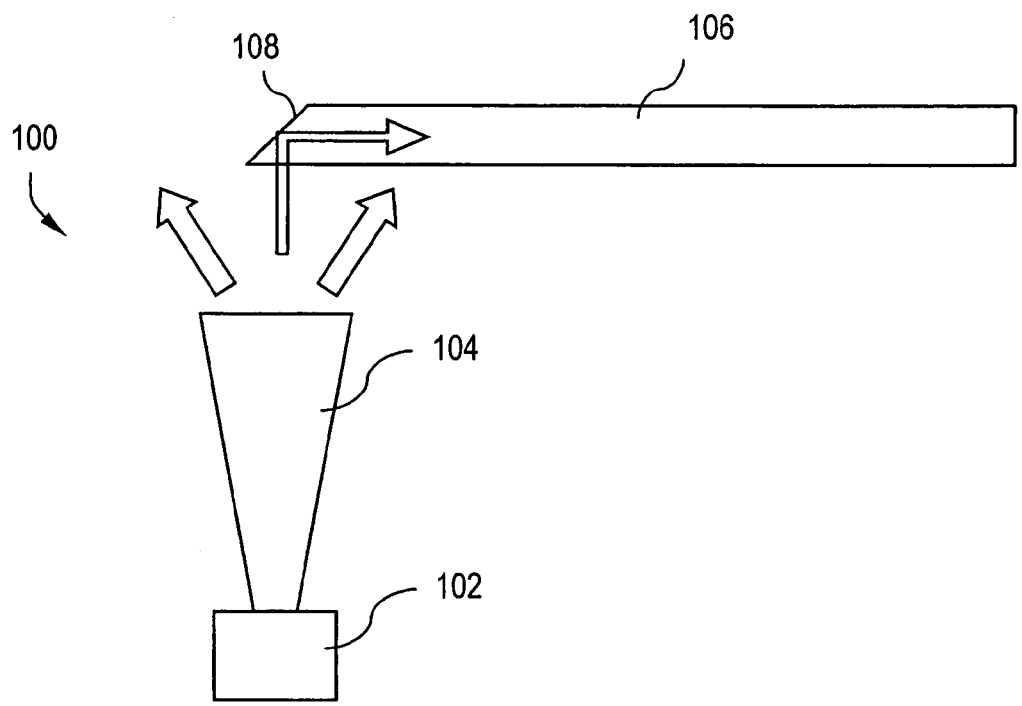
Figure 4:
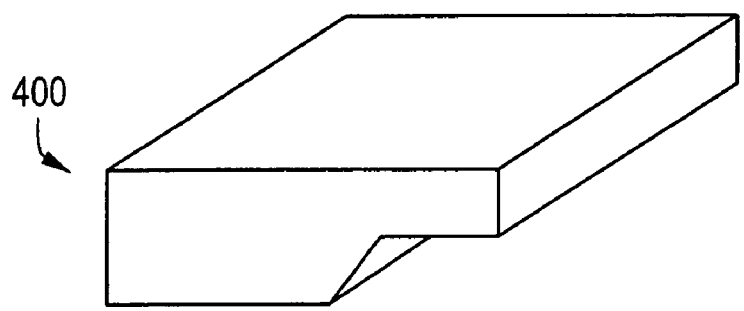
FIG. 4 is a perspective view of an individual stamping mold.

FIG. 4 is a perspective view of an individual stamp or mold 400. Because the etching process illustrated in FIGS. 3(a) through 3(e) results in opposingly tapered 45-degree surfaces, the wafer is subsequently diced or cleaved to form the individual molds 400 needed to form a tapered waveguide, such as those illustrated in FIGS. 1(a) and (b).

Figure 5A:
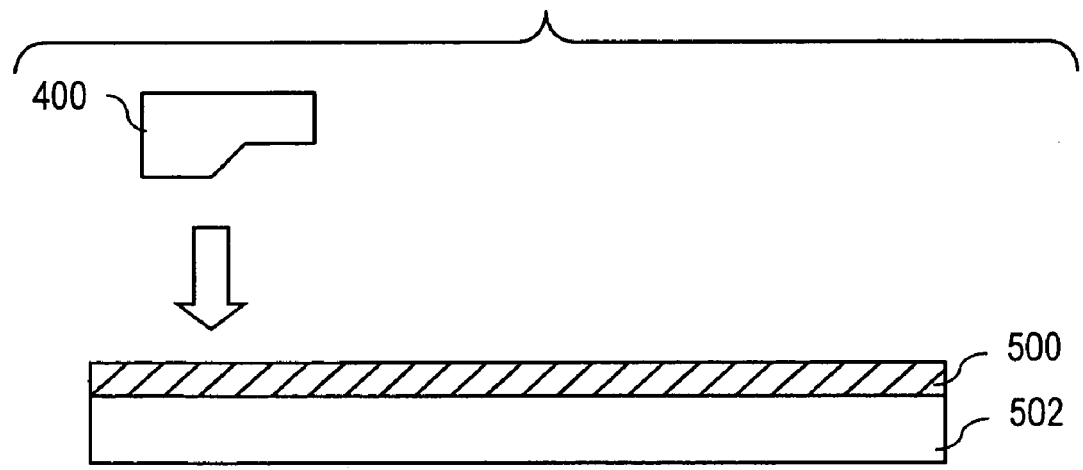
FIGS. 5(a) and 5(b) illustrate the use of a stamping mold to created a tapered waveguide by compression molding of a polymer coated substrate.
Figure 5B:
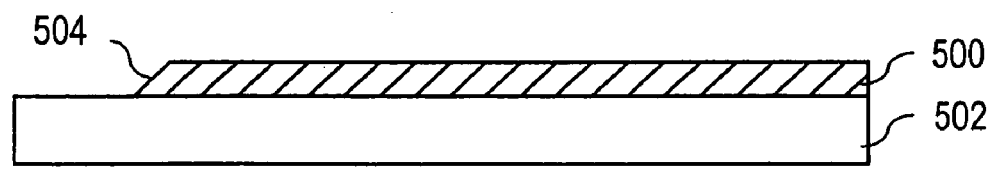

Finally, FIGS. 5(a) and 5(b) schematically illustrate the application of a fabricated mold 400 to a waveguide material 500 coated upon a silicon substrate 502. The waveguide material 500 is compression molded in accordance with the features of mold 400, thereby resulting in a tapered surface 504 having a practical use (such as the 45-degree mirror, for example, discussed above).

EXAMPLE

A variety of stamps fabricated in accordance with the above described methodology were used to imprint sub-micron features into a film of polymer using a SUSS MicroTec FC150 flip-chip bonder. The process of compression molding in general involves pressing a micro-machined stamp into a layer of polymer using a combination of heat and pressure to form structures such as, for example, optical waveguides. In the specific example illustrated, a stamp approximately 3×3 mm, square included raised lines about 1 mm long with varying widths ranging from about 5-20 microns. In addition, the polymer layers were formed by coating the polymer material upon a plurality of 4-inch silicon wafers.

The FC 150 bonder was configured with a 50-kg Universal Bonding Arm (UBA) and a high-force, 2-inch chuck with a high-accuracy stage. The chuck and arm had heaters capable producing temperatures of about of 450 degrees Celsius (EC). The bonder was further configured to accommodate 2-inch trays for the chips. Because the machine was set up with a 2-inch chuck, the gas confinement frame was removed from the face of the chuck so as not to interfere with the 4-inch wafers. This allowed the machine to support 2-inch-square sections of the wafer with vacuum conditions. The stamps were placed face down into a plastic cassette, and thereafter placed onto the chip tray support. A 2-inch vacuum tool with a 5 mm pedestal and a 1 mm hole was then used to affix the stamp onto the UBA. As there were no fiducial (alignment) marks on the initial wafer, the first stamping was performed without any alignment steps. Subsequently, each preceding imprint was aligned with respect to its neighbor so that a 3×3 matrix was formed.

In accordance with previous studies, one key to successful stamping is working around the glass transition temperature (Tg), which represents the boundary between plastic deformation and brittle fracturing. Ideally, the stamp should be pressed into the polymer and held at a temperature greater than Tg. Then, the temperature is cooled below Tg before releasing the stamp. In the present example, stamping temperatures of 125EC, 150EC, and 175EC (with a background temperature of 120EC) were used, in combination with stamping forces of 10, 15, and 20 kg (to generate stamping pressures from about 10–20 Mpa).

After the stamping process was completed, the imprints were observed under a microscope. It was found that an increase in stamping temperature did not show any significant effects to the imprint. On the other hand, an increasing stamping force was noted to cause the material around the edges of the imprinted lines to bulge. In the extreme case of 175EC and 20 kg, a section of polymer was removed. Small irregular features could be seen within and around the lines. In certain instances, the irregular features were repeated from one imprint to the next. The faint scratches mentioned above can be seen in the third image. Imprints appeared to be level with no over-pressing on any side.

Changes in pressing temperature appeared to have little effect on the features for all the force classes, while noticeable bulging in the material around the lines could be seen for increased forces. In addition, the irregular features were found to correspond to debris adhered to the stamp. The resolution of these marks may thus be an indication of how fine of a feature the process is capable of replicating. Overall, the example demonstrated an ability to control all the relevant parameters (e.g., stamp leveling, alignment, temperature, and pressing force) involved in achieving a successful stamping process. Results from these initial tests indicate that the temperatures used had little effect on results, which could indicate that the processing window for temperatures may be fairly wide. Increasing the pressing force caused the material surrounding the pressed features to swell, and thus may represent the effects of applying too much force.

In a preferred embodiment, the stamping process utilizes a machine configuration that includes at least a 50 kg UBA with a 2-inch heater, a high force chuck with 6-inch heater, and a high-resolution chuck stage. If a step and stamp process is implemented, automatic alignment methods are preferred, such as by including fiducial marks on the stamps.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of fabricating a stamping mold suitable for use in the formation of a tapered waveguide structure, the method comprising:
    defining a stamping pattern upon the surface of a silicon wafer; and
    removing portions of said silicon wafer surface by crystallographic etching thereof in accordance with said stamping pattern, thereby creating tapered vertical surfaces within said wafer, wherein said silicon wafer is initially formed at an off-axis angle with respect to a <100> crystal orientation.

2. The method of claim 1, wherein said off-axis angle is about 9 degrees.

3. The method of claim 2, further comprising sectioning said silicon wafer into individual molds, each of said molds having a single tapered surface.

4. A method of fabricating a stamping mold suitable for use in the formation of a tapered waveguide structure, the method comprising:
    defining a stamping pattern upon the surface of a silicon wafer; and
    removing portions of said silicon wafer surface by crystallographic etching thereof in accordance with said stamping pattern, thereby creating tapered vertical surfaces within said wafer, wherein an angle of said tapered vertical surfaces with respect to a normal to said surface of said silicon wafer is approximately 45 degrees, wherein said silicon wafer is initially formed at an off-axis angle with respect to a desired crystal orientation.

5. The method of claim 4, wherein said off-axis angle is selected to provide said angle of said tapered vertical surfaces with respect to said normal to said surface of said silicon wafer equal to approximately 45 degrees.

6. The method of claim 5, wherein said off-axis angle is approximately 9 degrees.

7. A method of fabricating a stamping mold suitable for use in the formation of a tapered waveguide structure, the method comprising:
    defining a stamping pattern upon the surface of a silicon wafer; and
    removing portions of said silicon wafer surface by crystallographic etching thereof in accordance with said stamping pattern, thereby creating tapered vertical surfaces within said wafer, wherein an angle of said tapered vertical surfaces with respect to a normal to said surface of said silicon wafer is approximately 45 degrees.

8. The method of claim 7, wherein said silicon wafer is initially formed at an off-axis angle with respect to a desired crystal orientation.

9. The method of claim 8, wherein said off-axis angle is approximately 9 degrees.

10. The method of claim 8, wherein said silicon wafer is initially formed at an off-axis angle with respect to a <100> crystal orientation.

* * * * *

UNITED STATES PATENT AND TRADEMARK OFFICE
CERTIFICATE OF CORRECTION

PATENT NO. : 7,018,580 B2  
APPLICATION NO. : 10/248095  
DATED : March 28, 2006  
INVENTOR(S) : Samhita Dasgupta et al.

It is certified that error appears in the above-identified patent and that said Letters Patent is hereby corrected as shown below:

Title Page, under Item (12), delete "Gorczyca et al." replace with --Dasgupta et al.--.

Title Page, Item (75) Inventors: should read --Samhita Dasgupta, Thomas Bert Gorczyca, Christopher James Kapusta, Stacey Joy Goodwin--.

Signed and Sealed this

Eighteenth Day of August, 2009

David J. Kappos
*Director of the United States Patent and Trademark Office*